United States Patent
Cheng et al.

(10) Patent No.: US 9,269,629 B2
(45) Date of Patent: Feb. 23, 2016

(54) DUMMY FIN FORMATION BY GAS CLUSTER ION BEAM

(71) Applicant: GLOBALFOUNDRIES Inc., Grand Cayman (KY)

(72) Inventors: Kangguo Cheng, Schenectady, NY (US); Balasubramanian S. Haran, Watervliet, NY (US); Ali Khakifirooz, Los Altos, CA (US); Shom Ponoth, Clifton Park, NY (US); Theodorus Eduardus Standaert, Clifton Park, NY (US); Tenko Yamashita, Schenectady, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/528,830

(22) Filed: Oct. 30, 2014

(65) Prior Publication Data
US 2015/0064874 A1 Mar. 5, 2015

Related U.S. Application Data

(62) Division of application No. 13/684,842, filed on Nov. 26, 2012, now Pat. No. 8,946,792.

(51) Int. Cl.
*H01L 21/76* (2006.01)
*H01L 21/8234* (2006.01)
(Continued)

(52) U.S. Cl.
CPC .... *H01L 21/823481* (2013.01); *H01L 21/0217* (2013.01); *H01L 21/02164* (2013.01); *H01L 21/02227* (2013.01); *H01L 21/02238* (2013.01); *H01L 21/02247* (2013.01); *H01L 21/266* (2013.01); *H01L 21/26506* (2013.01); *H01L 21/26566* (2013.01); *H01L 21/26586* (2013.01); (Continued)

(58) Field of Classification Search
CPC ............... H01L 21/823481; H01L 21/0217; H01L 21/02227; H01L 21/26566; H01L 21/845; H01L 29/6681
USPC ............................................ 438/216, 423
See application file for complete search history.

(56) References Cited

U.S. PATENT DOCUMENTS

| 5,130,268 A * | 7/1992 | Liou | H01L 21/76227 257/E21.547 |
| 5,907,780 A * | 5/1999 | Gilmer | H01L 29/518 257/E21.192 |

(Continued)

OTHER PUBLICATIONS

M. Kitazawa et al.; Sub-30-nm PMOSFET Using Gas Cluster Ion Beam Boron Doping for 45-nm Node CMOS and Beyond; 7th International Workshop on Junction Technology, IEEE; 2007; pp. 61-62.

*Primary Examiner* — Yosef Gebreyesus
(74) *Attorney, Agent, or Firm* — Heslin Rothenberg Farley & Mesiti P.C.

(57) ABSTRACT

FinFET structures with dielectric fins and methods of fabrication are disclosed. A gas cluster ion beam (GCIB) tool is used to apply an ion beam to exposed fins, which converts the fins from a semiconductor material such as silicon, to a dielectric such as silicon nitride or silicon oxide. Unlike some prior art techniques, where some fins are removed prior to fin merging, in embodiments of the present invention, fins are not removed. Instead, semiconductor (silicon) fins are converted to dielectric (nitride/oxide) fins where it is desirable to have isolation between groups of fins that comprise various finFET devices on an integrated circuit (IC).

8 Claims, 8 Drawing Sheets

(51) Int. Cl.
*H01L 21/84* (2006.01)
*H01L 29/66* (2006.01)
*H01L 27/088* (2006.01)
*H01L 27/12* (2006.01)
*H01L 21/02* (2006.01)
*H01L 29/78* (2006.01)
*H01L 21/265* (2006.01)
*H01L 21/266* (2006.01)
*H01L 27/02* (2006.01)

(52) U.S. Cl.
CPC ...... *H01L 21/823431* (2013.01); *H01L 21/845* (2013.01); *H01L 27/0886* (2013.01); *H01L 27/1211* (2013.01); *H01L 29/6681* (2013.01); *H01L 29/78* (2013.01); *H01L 27/0207* (2013.01)

(56) References Cited

U.S. PATENT DOCUMENTS

| | | | |
|---|---|---|---|
| 6,124,620 A * | 9/2000 | Gardner | H01L 21/26506 257/349 |
| 7,947,582 B2 * | 5/2011 | Hautala | H01L 21/28273 250/423 R |
| 7,968,422 B2 | 6/2011 | Hautala | |
| 8,048,788 B2 | 11/2011 | Hautala et al. | |
| 8,207,032 B2 | 6/2012 | Fischer et al. | |
| 8,227,875 B2 | 7/2012 | Hu et al. | |
| 8,603,881 B1 * | 12/2013 | Alptekin | H01L 29/41783 257/E21.409 |
| 8,609,480 B2 * | 12/2013 | Xie | H01L 29/66795 257/E21.249 |
| 8,679,914 B2 * | 3/2014 | Quick | H01L 27/2436 257/E31.029 |
| 8,728,908 B2 * | 5/2014 | Xie | H01L 21/28088 438/431 |
| 2007/0287256 A1 | 12/2007 | Chang et al. | |
| 2008/0128797 A1 * | 6/2008 | Dyer | H01L 29/785 257/328 |
| 2008/0203447 A1 | 8/2008 | Arnold et al. | |
| 2008/0230852 A1 * | 9/2008 | Yu | H01L 21/823431 257/401 |
| 2009/0124069 A1 * | 5/2009 | Clark, Jr. | H01L 21/26586 438/525 |
| 2010/0155776 A1 | 6/2010 | Lee | |
| 2010/0264468 A1 * | 10/2010 | Xu | H01L 29/66795 257/288 |
| 2011/0031552 A1 | 2/2011 | Iwamatsu et al. | |
| 2011/0049629 A1 * | 3/2011 | Ishikawa | H01L 21/76243 257/350 |
| 2011/0084216 A1 * | 4/2011 | Hautala | C23C 14/221 250/398 |
| 2012/0052640 A1 | 3/2012 | Fischer et al. | |
| 2013/0273737 A1 * | 10/2013 | Alptekin | H01L 21/02068 438/664 |

* cited by examiner

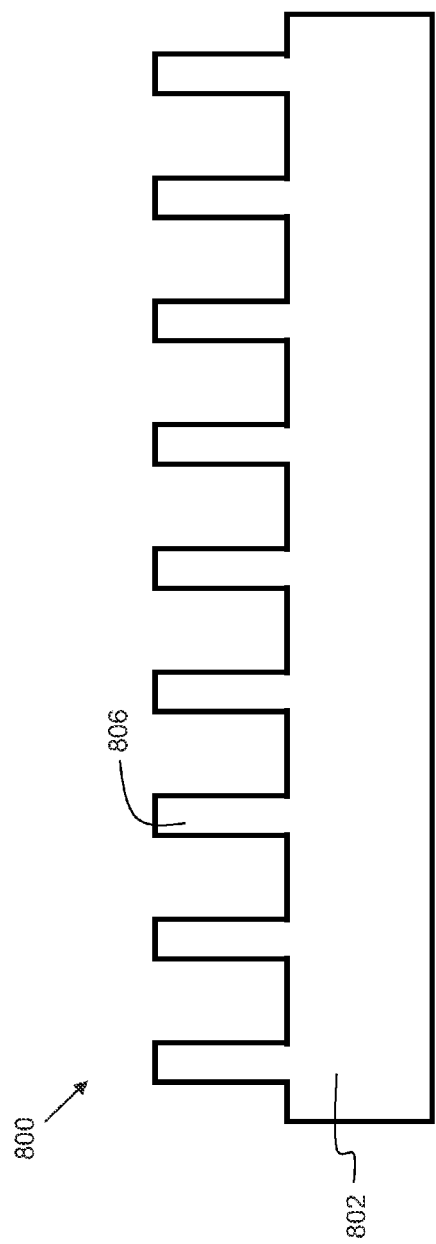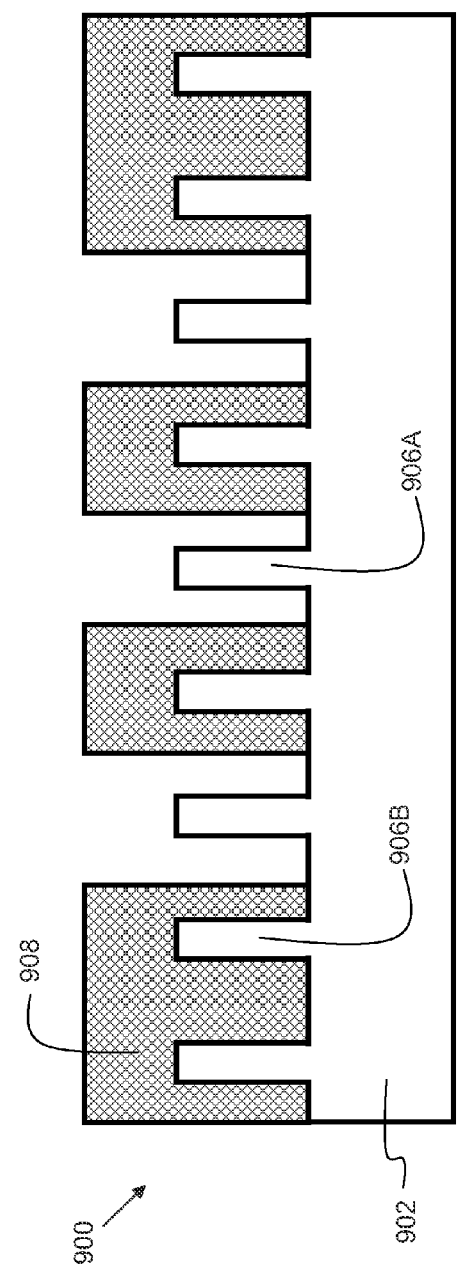

US 9,269,629 B2

DUMMY FIN FORMATION BY GAS CLUSTER ION BEAM

CROSS REFERENCE TO RELATED APPLICATIONS

This application is a division of commonly-owned, copending U.S. patent application Ser. No. 13/684,842 entitled DUMMY FIN FORMATION BY GAS CLUSTER ION BEAM and filed on Nov. 26, 2012.

FIELD OF THE INVENTION

The present invention relates generally to semiconductor fabrication, and more particularly, to fin field effect transistor (finFET) structures and methods of fabrication.

BACKGROUND OF THE INVENTION

With the continuing trend towards miniaturization of integrated circuits (ICs), there is a need for transistors with increasingly smaller dimensions. FinFET technology is becoming more prevalent as device size continues to shrink. It is therefore desirable to have improved finFET devices and methods of fabrication.

SUMMARY OF THE INVENTION

In one embodiment, a semiconductor structure is provided. The structure comprises a semiconductor substrate, an insulator layer disposed on the semiconductor substrate, a plurality of fins disposed on the insulator layer, wherein a first subset of the plurality of fins are comprised of a semiconductor material and wherein a second subset of the plurality of fins are comprised of a dielectric material.

In another embodiment, a semiconductor structure is provided. This structure comprises a semiconductor substrate, a plurality of fins formed on the semiconductor substrate, wherein a first subset of the plurality of fins are comprised of a semiconductor material and wherein a second subset of the plurality of fins are comprised of a dielectric material.

In another embodiment, a method for converting a subset of a plurality of semiconductor fins on a semiconductor structure into dielectric fins is provided. The method comprises masking a first subset of the plurality of fins, leaving a second subset of the plurality of fins as unmasked fins, and applying a gas cluster ion beam to the unmasked fins to convert the unmasked fins into dielectric fins.

In another embodiment, a method for converting a subset of a plurality of semiconductor fins on a semiconductor structure into dielectric fins is provided. The method comprises masking a first subset of the plurality of fins, leaving a second subset of the plurality of fins as unmasked fins, and applying ion implantation to the unmasked fins to convert the unmasked fins into dielectric fins.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
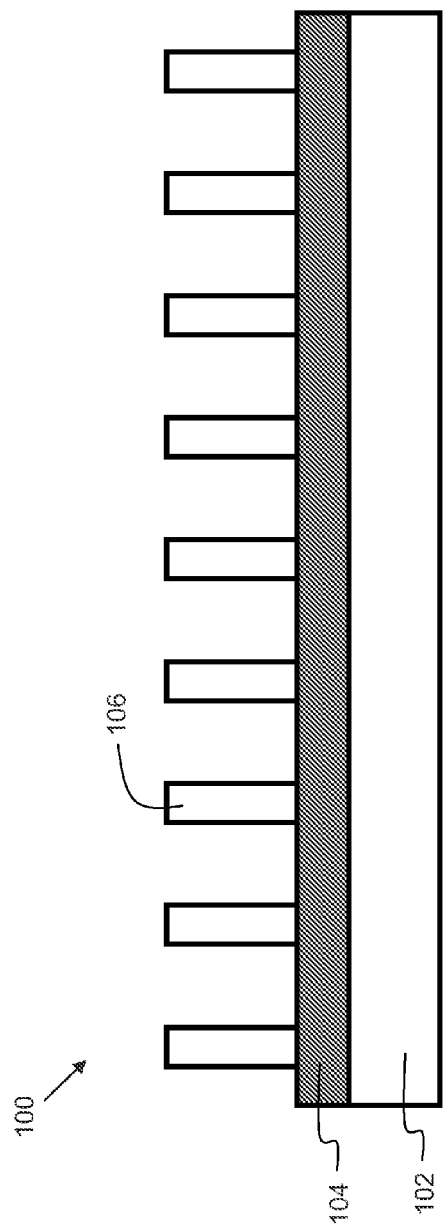

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 shows a SOI semiconductor structure at a starting point for an embodiment of the present invention.

Figure 2:
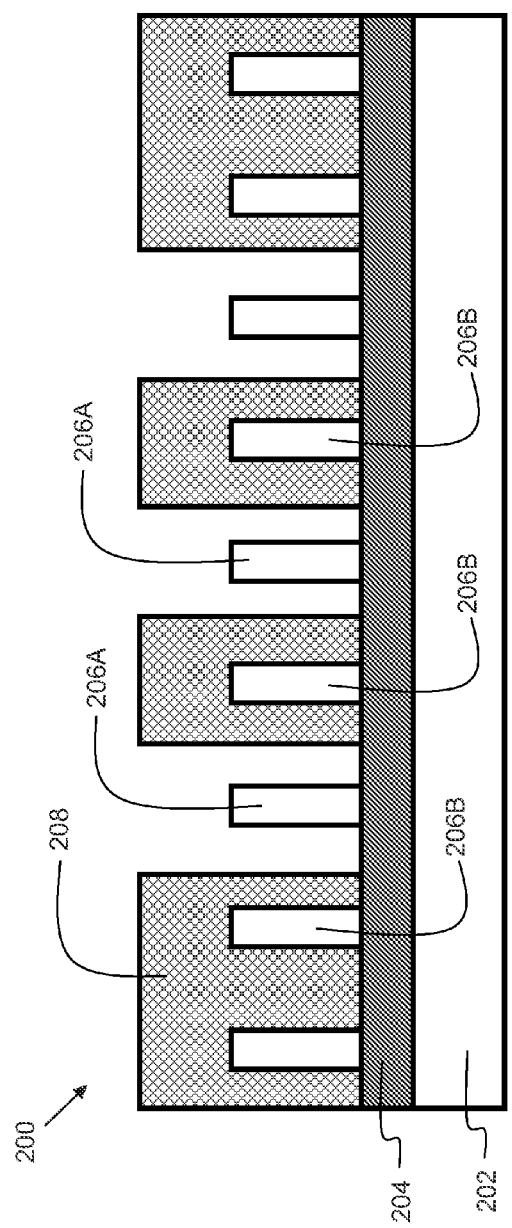

FIG. 2 shows a SOI semiconductor structure after a subsequent processing step of applying a mask over a subset of the fins.

Figure 3:
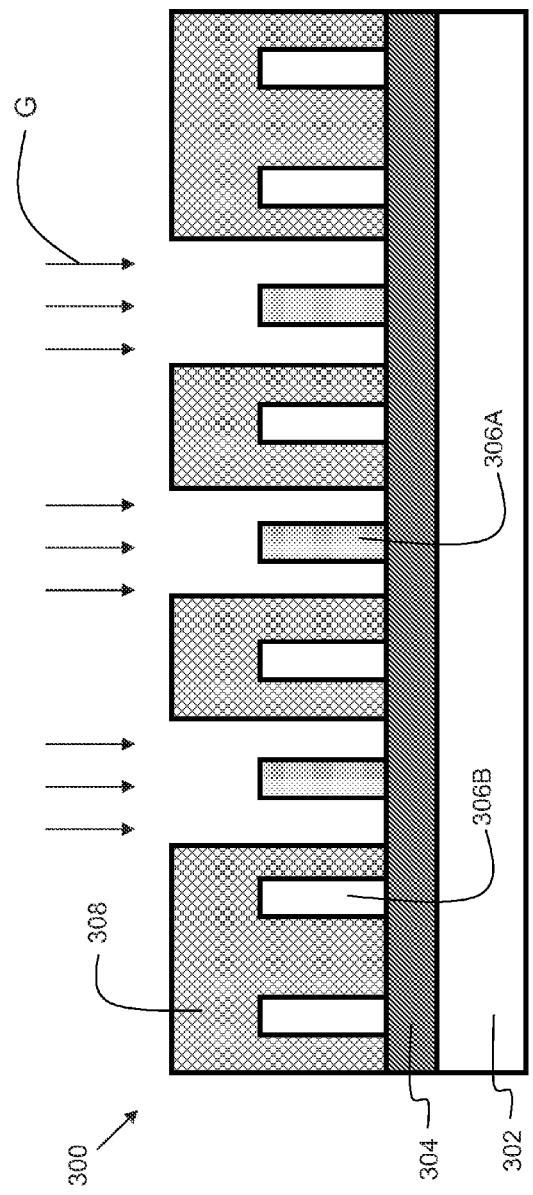

FIG. 3 shows a SOI semiconductor structure after a subsequent processing step of applying a gas cluster ion beam to the structure.

Figure 4:
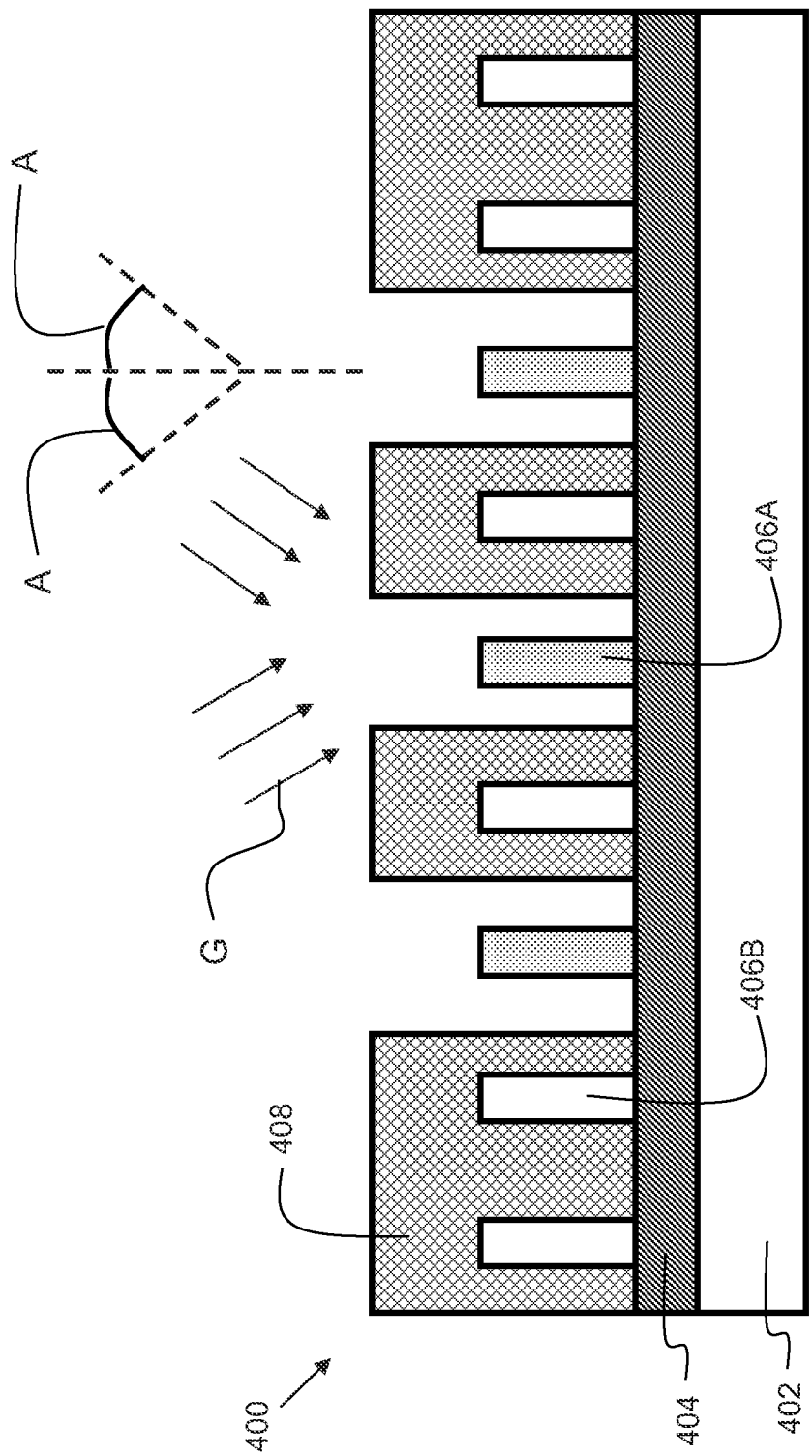

FIG. 4 illustrates an alternative embodiment of an angular application of a gas cluster ion beam to the structure.

Figure 5:
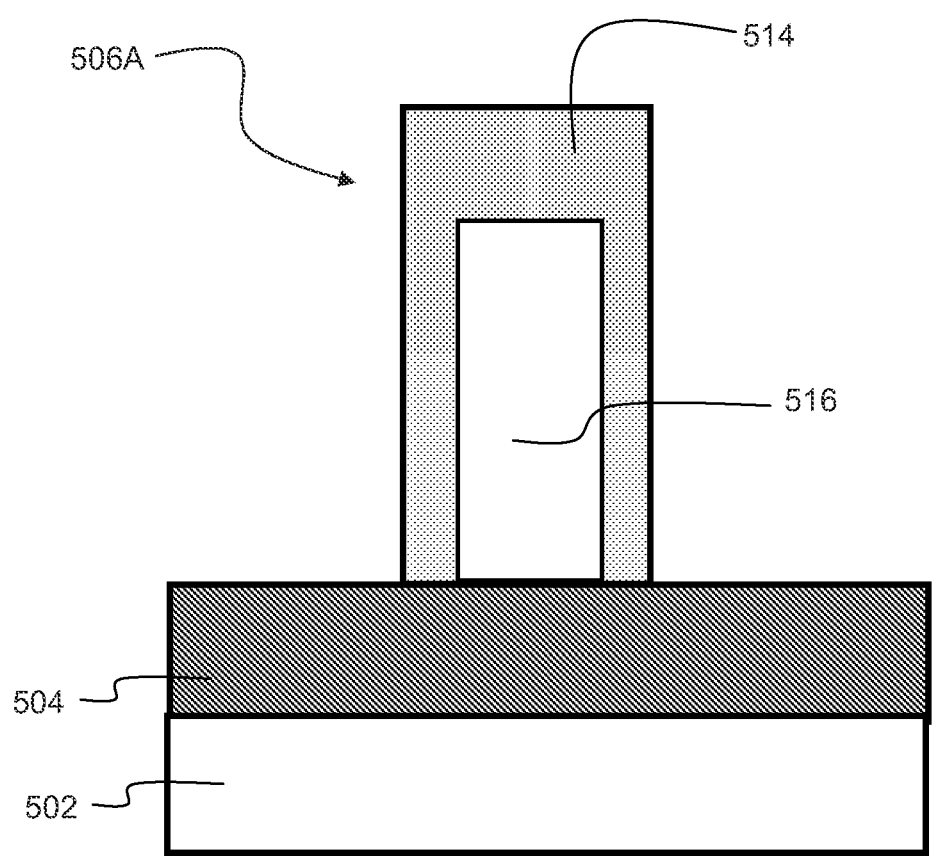

FIG. 5 illustrates details of an alternative embodiment of the present invention with a partially converted fin structure.

Figure 6:
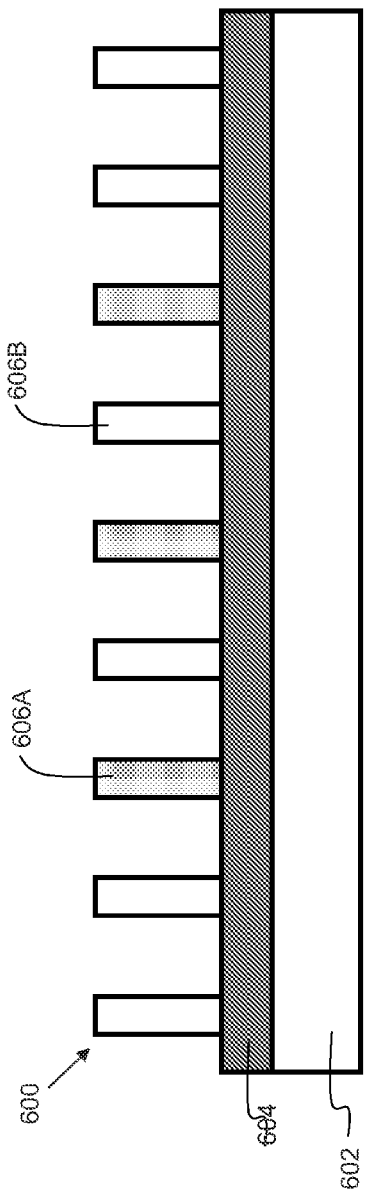

FIG. 6 shows a SOI semiconductor structure after a subsequent processing step of removing the mask.

Figure 7:
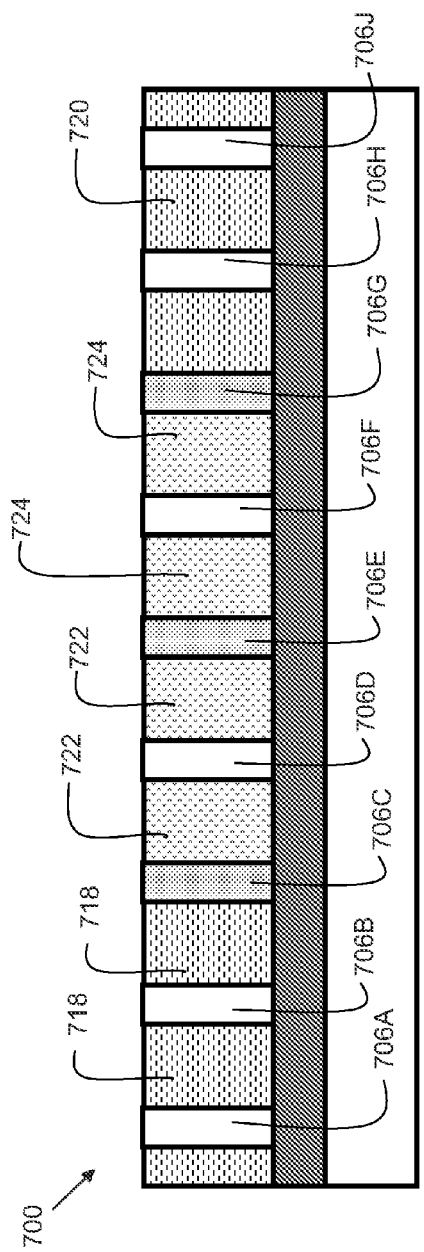

FIG. 7 shows a SOI semiconductor structure after a subsequent processing step of fin merging.

FIG. 8 shows a bulk semiconductor structure at a starting point for an embodiment of the present invention.

FIG. 9 shows a bulk semiconductor structure after a subsequent processing step of applying a mask over a subset of the fins.

Figure 10:
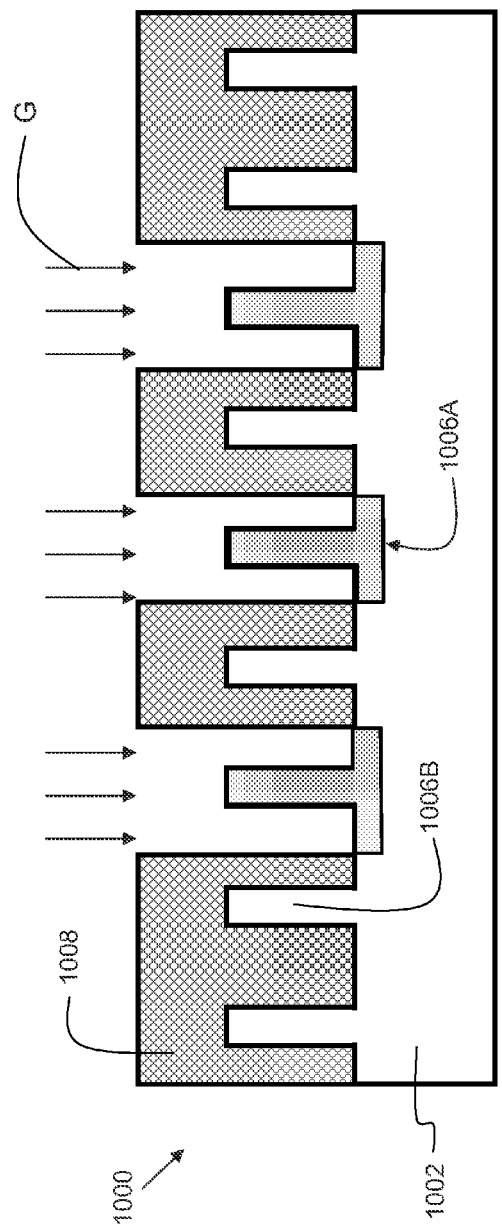

FIG. 10 shows a bulk semiconductor structure after a subsequent processing step of applying a gas cluster ion beam to the structure.

Figure 11:
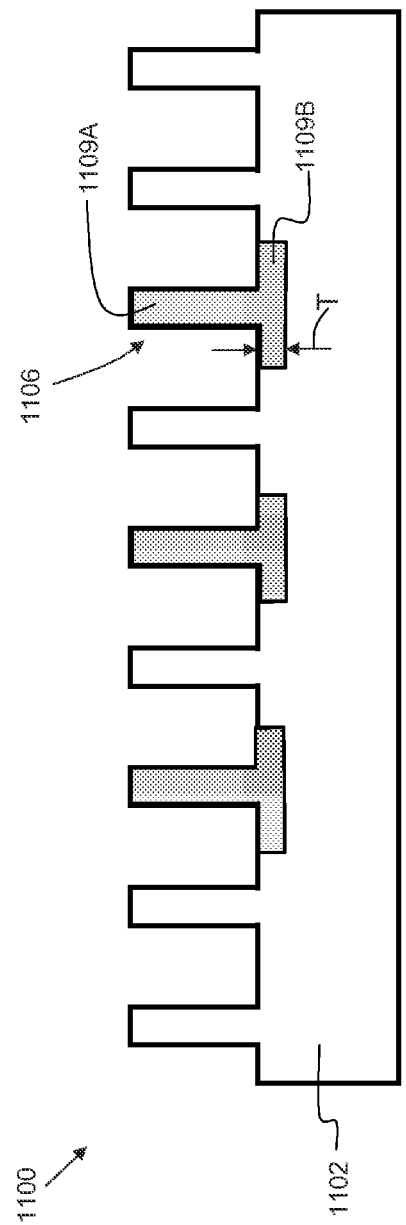

FIG. 11 shows a bulk semiconductor structure after a subsequent processing step of removing the mask.

Figure 12:
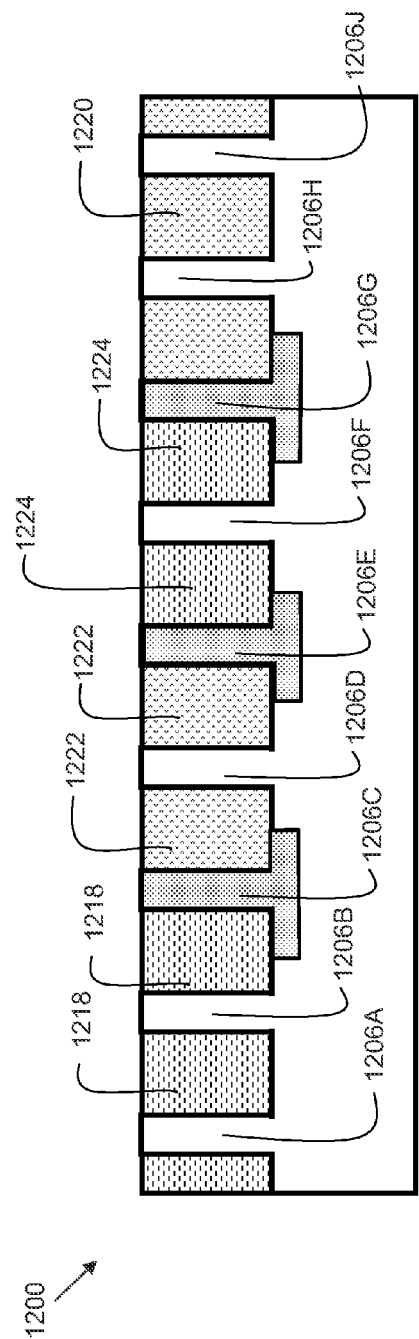

FIG. 12 shows a bulk semiconductor structure after a subsequent processing step of fin merging.

Figure 13:
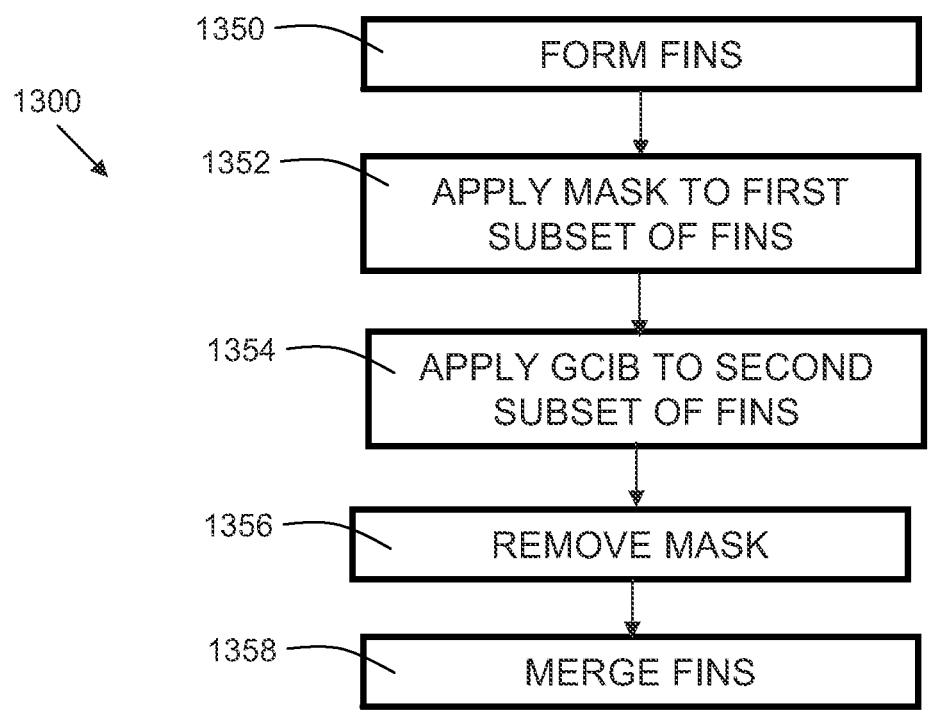

FIG. 13 is a flowchart indicating process steps for a method in accordance with an embodiment of the present invention.

DETAILED DESCRIPTION

A practical issue with finFET manufacturing is that some finFETs may comprise multiple fins that require epitaxial merging of groups of fins, while other finFETS may utilize unmerged fins. Some devices, such as SRAM, may require finFETs with both merged and unmerged fins.

In prior art processes, some fins are removed to facilitate the merged and unmerged fins. There are various problems with this approach. Removing dummy fins causes fin density variation and thus causes dummy gate polysilicon non-planarization which leads to severe challenges in a subsequent replacement metal gate process (RMG).

Furthermore, removing dummy fins increases space between unmerged fins, but due to the lateral growth and epitaxial morphology, removing a single dummy fin does not provide adequate margin to completely prevent undesired fin merging. Therefore, usually multiple dummy fins need to be removed, decreasing circuit density, which increases the size of an SRAM or other integrated circuit.

Embodiments of the present invention overcome the aforementioned shortcomings by converting semiconductor (silicon) fins into insulating dielectric fins by utilizing a gas cluster ion beam process.

FIG. 1 shows a semiconductor-on-insulator (SOI) semiconductor structure 100 at a starting point for an embodiment of the present invention. Semiconductor structure 100 comprises a semiconductor substrate 102. Semiconductor substrate 102 forms the base of semiconductor structure 100. Semiconductor substrate 102 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Disposed on semiconductor substrate 102 is an insulator layer 104. Insulator layer 104 may comprise a buried oxide (BOX) layer. A thin semiconductor layer is disposed on top of the insulator layer 104. The thin semiconductor layer may be comprised of silicon. In alternative embodiments, silicon germanium, germanium, a III-V compound semiconductor, II-V semiconductor, or combination of those materials can be used to form the semiconductor layer on top of the insulator layer 104. Using industry-standard deposition and patterning techniques, a plurality of semiconductor fins 106 are formed on the insulator layer 104.

FIG. 2 shows a SOI semiconductor structure 200 after a subsequent processing step of applying mask 208 over a subset of the fins. As stated previously, similar elements may be referred to by similar numbers in various figures (FIGs) of the drawing, in which case typically the last two significant digits may be the same. For example, semiconductor substrate 202 of FIG. 2 is similar to semiconductor substrate 102 of FIG. 1. The regions of mask 208 are deposited over select fins (indicated generally as 206B) that are to be preserved as semiconductor fins. The unmasked (exposed) fins, those not covered by a region of mask 208, are designated generally as 206A. The exposed fins are to be converted to dielectric fins in upcoming process steps. In some embodiments, the material for mask 208 is comprised of photoresist. In other embodiments, the material for mask 208 is a hardmask, such as silicon oxide. Industry-standard patterning techniques may be used to form the mask regions over the desired fins that are to be maintained as semiconductor fins.

FIG. 3 shows a SOI semiconductor 300 structure after a subsequent processing step of applying a gas cluster ion beam (indicated by the arrows labeled as "G") to the structure. In gas cluster ion beam (GCIB) processing, a surface is bombarded by a beam of high energy, gas phase atomic clusters. The clusters are formed when a high pressure gas (e.g., 10 atmospheres) supersonically expands into a vacuum (e.g., 1×10-5 Torr), cools, and then condenses into weakly ionized clusters. The ionized clusters are accelerated electrostatically to very high velocities, and are focused into a tight beam that impacts a substrate surface. As opposed to a more dispersed ion implant process, atoms of a cluster ion impact and interact nearly simultaneously with the substrate atoms. In one embodiment, the GCIB species is nitrogen with an energy ranging from about 1 KeV to about 100 KeV, with a dosage ranging from about 5E13 atoms per cubic centimeter to about 2E15 atoms per cubic centimeter. The gas cluster ion beam is applied by a GCIB tool. When the beams G strike the exposed fins (shown generally as 306A), the silicon fins are converted to silicon nitride fins. Hence, semiconductor fins are converted to dielectric fins. In other embodiments, an oxygen species may be used instead of a nitrogen species, in which case, the exposed silicon fins are converted into silicon oxide fins. In another embodiment, both oxygen and nitrogen species may be used, in which case, the exposed silicon fins are converted into silicon oxynitride fins. In another embodiment, the semiconductor fins comprise silicon germanium and a nitrogen species may be used, in which case, the exposed silicon germanium fins are converted into silicon germanium nitride fins. The converted dielectric fins serve as barriers in an upcoming fin merging process. Additional embodiments of the present invention may utilize ion implantation instead of GCIB. That is, some embodiments may comprise applying ion implantation to the unmasked fins to convert the unmasked fins into dielectric fins, such as silicon nitride fins.

FIG. 4 illustrates a semiconductor structure 400 undergoing an angular application of a gas cluster ion beam to the structure in accordance with an alternative embodiment of the present invention. In this embodiment, the beams G are applied at an angle A to vertical. The beams G may be applied at a variety of intermediate angles ranging from 0 (vertical) to A. In some embodiments, A ranges from about 10 degrees from vertical to about 20 degrees from vertical. Applying the gas cluster ion beams G at an angle allows the entire fin to be converted to dielectric at a lower energy setting than in the vertical (straight down) case (see FIG. 3). This embodiment can be used to keep the energy lower in cases where it is desirable to avoid structure damage due to too high an energy of the gas cluster ion beams.

FIG. 5 illustrates details of an alternative embodiment of the present invention with a partially converted fin structure. Fin 506A is comprised of an outer portion 514 that is comprised of converted dielectric, such as oxide or nitride, and which surrounds a central portion 516 that is comprised of silicon. This embodiment utilizes lower energy GCIB settings, such that the entire fin is not converted to dielectric. The GCIB beam may be applied at various angles (see FIG. 4) such that the outer portion 514 is converted to dielectric, but the energy settings are such that the GCIB beam does not convert the central portion 516 to dielectric, and thus, it remains as silicon. However, with the outer portion 514 converted to dielectric, fin 506A can still serve the purpose of a dielectric fin.

FIG. 6 shows a SOI semiconductor 600 structure after a subsequent processing step of removing the mask (compare with 308 of FIG. 3). The mask may be removed using a selective process that only removes the mask material, but does not significantly affect the silicon fins 606B, dielectric fins 606A, or insulator layer 604. The dielectric fins 606A may be interleaved with the silicon fins 606B, such that there are single dielectric fins disposed between two silicon fins, and one or more silicon fins disposed between each dielectric fin.

FIG. 7 shows a SOI semiconductor structure 700 after a subsequent processing step of fin merging. In embodiments, fins are merged with epitaxially grown silicon, silicon germanium, carbon doped silicon, or any suitable combination of those materials. The epitaxially grown silicon may be in-situ doped with various dopants, depending on if the particular semiconductor fins are to be part of an NFET or a PFET. Note that for FIG. 7, each fin is labeled with a reference for the purposes of explaining the semiconductor structure. Fins 706A, 706B, 706D, 706F, 706H, and 706J are semiconductor fins, indicated as white. Fins 706C, 706E, and 706G are dielectric fins, indicated as shaded.

Epitaxial region 718 merges fins 706A and 706B. Dielectric fin 706C serves as an isolation region which prevents epitaxial region 718 from affecting semiconductor fins 706D, 706F, 706H, and 706J, which are to the right of dielectric fin 706C. In some embodiments, fins 706A and 706B comprise an NFET transistor, and epitaxial region 718 may be in situ doped with arsenic or phosphorous.

Epitaxial region 722 is bounded by dielectric fin 706C and dielectric fin 706E. In some embodiments semiconductor fin 706D may comprise a PFET transistor, and epitaxial region 722 may be in situ doped with boron and is in direct physical contact with semiconductor fin 706D. Semiconductor fin 706D may be part of a single-fin finFET. Such finFETs have use in various applications, such as pull-up gates used in SRAM, for example. It is therefore advantageous to be able to have a single semiconductor fin (706D) disposed between two dielectric fins (706C and 706E) to support these applications.

Epitaxial region 724 is bounded by dielectric fin 706E and dielectric fin 706G. Epitaxial region 724 is in direct physical contact with semiconductor fin 706F. Semiconductor fin 706F may be part of an additional single-fin finFET. In some embodiments, semiconductor fin 706F may be part of a single-fin PFET, and epitaxial region 724 may be doped with boron, in a manner similar to epitaxial region 722.

Epitaxial region 720 merges fins 706H and 706J. Dielectric fin 706G serves as an isolation region which prevents epitaxial region 720 from affecting semiconductor fins 706A, 706B, 706D, and 706F, which are to the left of dielectric fin 706G. In some embodiments, fins 706H and 706J comprise an NFET transistor, and epitaxial region 720 may be in situ doped with arsenic or phosphorous, in a manner similar to epitaxial region 718. From this point forward, an industry-standard process flow may be used to complete the finFET.

FIG. 8 shows a bulk semiconductor structure 800 at a starting point for an embodiment of the present invention. Semiconductor structure 800 comprises a bulk silicon substrate 802, which may be in the form of a wafer or die or portion thereof. A plurality of fins, indicated generally as 806, are formed on the silicon substrate 802. The fins 806 may be formed using industry standard patterning techniques. Unlike the SOI structure 100 (see FIG. 1), there is no blanket insulator layer (compare with 104 of FIG. 1) between the fins 806 and the silicon substrate 802.

FIG. 9 shows a bulk semiconductor structure 900 after a subsequent processing step of applying a mask 908 over a subset of the fins. The regions of mask 908 are deposited over select fins (indicated generally as 906B) that are to be preserved as semiconductor fins. The exposed fins, those not covered by a region of mask 908, are designated generally as 906A. In some embodiments, the material for mask 908 is comprised of photoresist. In other embodiments, the material for mask 908 is an oxide, such as silicon oxide. Industry-standard patterning techniques may be used to form the mask regions over the desired fins that are to be maintained as semiconductor fins.

FIG. 10 shows a bulk semiconductor structure 1000 after a subsequent processing step of applying a gas cluster ion beam (indicated by the arrows labeled as "G") to the structure. Similar to as described for the SOI case of FIG. 3, the gas cluster ion beam process serves to convert exposed fins from silicon, into a dielectric material, such as silicon oxide or silicon nitride. Some embodiments that use a bulk semiconductor structure may also utilize angular GCIB application as shown in FIG. 4. Since there is no blanket insulator (such as 104 of FIG. 1) a portion of the silicon substrate 1002 is also converted to a dielectric material, resulting in an "inverted-T region" of dielectric (such as silicon nitride silicon oxide, silicon oxynitride, or silicon germanium nitride).

FIG. 11 shows a bulk semiconductor structure 1100 after a subsequent processing step of removing the mask (compare with region of mask 1008 of FIG. 10). As shown in FIG. 11, dielectric fins (indicated generally as 1106) each comprise a fin portion 1109A and a horizontal portion 1109B located below and adjacent to fin portion 1109A. In some embodiments, the horizontal portion 1109B has a thickness T ranging from about 3 nanometers to about 100 nanometers.

FIG. 12 shows a bulk semiconductor structure 1200 after a subsequent processing step of fin merging. The fins are merged in a manner similar to that described for the SOI structure in FIG. 7. Some finFETs may comprise multiple merged fins, and other finFETs may be single-fin finFETs. Epitaxial region 1218 merges fins 1206A and 1206B. Dielectric fin 1206C serves as an isolation region which prevents epitaxial region 1218 from affecting semiconductor fins 1206D, 1206F, 1206H, and 1206J, which are to the right of dielectric fin 1206C. In some embodiments, fins 1206A and 1206B comprise an NFET transistor, and epitaxial region 1218 may be in situ doped with arsenic or phosphorous.

Epitaxial region 1222 is bounded by dielectric fin 1206C and dielectric fin 1206E. In some embodiments semiconductor fin 1206D may be part of a PFET transistor, and epitaxial region 1222 may be in situ doped with boron and is in direct physical contact with semiconductor fin 1206D. Semiconductor fin 1206D may be part of a single-fin finFET. Such finFETs have use in various applications, such as pull-up gates used in SRAM, for example. It is therefore advantageous to be able to have a single semiconductor fin (1206D) disposed between two dielectric fins (1206C and 1206E) to support these applications.

Epitaxial region 1224 is bounded by dielectric fin 1206E and dielectric fin 1206G. Epitaxial region 1224 is in direct physical contact with semiconductor fin 1206F. Semiconductor fin 1206F may be part of an additional single-fin finFET. In some embodiments, semiconductor fin 1206F may be part of a single-fin PFET, and epitaxial region 1224 may be doped with boron, in a manner similar to epitaxial region 1222.

Epitaxial region 1220 merges fins 1206H and 1206J. Dielectric fin 1206G serves as an isolation region which prevents epitaxial region 1220 from affecting semiconductor fins 1206A, 1206B, 1206D, and 1206F, which are to the left of dielectric fin 1206G. In some embodiments, fins 1206H and 1206J are part of an NFET transistor, and epitaxial region 1220 may be in situ doped with arsenic or phosphorous, in a manner similar to epitaxial region 1218. From this point forward, an industry-standard process flow may be used to complete the finFET.

FIG. 13 is a flowchart 1300 indicating process steps for a method in accordance with an embodiment of the present invention. In process step 1350, fins are formed on a substrate (see 106 of FIG. 1). In process step 1352, a mask is deposited over a subset of the fins (see 208 of FIG. 2). In process step 1354, gas cluster ion beams are directed to the structure (see G in FIG. 3 and FIG. 4). In process step 1356, the mask regions are removed (see FIG. 6). In process step 1358, the fins are merged via eptiaxially grown silicon (see 718, 720, 722, and 724 of FIG. 7).

Embodiments of the present invention provide for finFET structures with dielectric fins and methods of fabrication. In embodiments, a gas cluster ion beam (GCIB) tool is used to apply an ion beam to exposed fins, which converts the fins from a semiconductor material such as silicon, to a dielectric such as silicon nitride or silicon oxide. Unlike some prior art techniques, where some fins are removed prior to fin merging, in embodiments of the present invention, fins are not removed. Instead, semiconductor (silicon) fins are converted to dielectric (nitride/oxide) fins where it is desirable to have isolation between groups of fins that comprise various finFET devices on an integrated circuit (IC).

Advantages of embodiments of the present invention include facilitating a single dummy dielectric fin to provide robust isolation, which increases circuit density. Increasing circuit density is important in applications such as SRAM, and thus, embodiments of the present invention are well-suited to use in SRAM devices.

Another advantage of embodiments of the present invention is that, by leaving the dielectric fins in place, rather than removing the fins, the topography of the various layers that get deposited over the fins during completion of the fabrication process is more uniform. The more uniform topography reduces complications in downstream processing steps and thus may serve to improve product yield.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for converting a subset of a plurality of semiconductor fins on a semiconductor structure into dielectric fins, comprising:
    masking a first subset of the plurality of fins, leaving a second subset of the plurality of fins as unmasked fins; and
    applying a gas cluster ion beam to the unmasked fins to convert the unmasked fins into dielectric fins.

2. The method of claim 1, wherein masking the first subset of fins comprises depositing photoresist.

3. The method of claim 1, wherein masking the first subset of fins comprises depositing oxide.

4. The method of claim 1, wherein applying a gas cluster ion beam to the unmasked fins comprises applying a gas cluster ion beam at an angle ranging from about 10 degrees to about 20 degrees from vertical.

5. The method of claim 1, wherein applying a gas cluster ion beam to the unmasked fins comprises applying a gas cluster ion beam with a nitrogen species, at an energy ranging from 1 KeV to 100 KeV, and at a dosage ranging from about 5E13 atoms per cubic centimeter to about 2E15 atoms per cubic centimeter.

6. A method for converting a subset of a plurality of semiconductor fins on a semiconductor structure into dielectric fins, comprising:
    masking a first subset of the plurality of fins, leaving a second subset of the plurality of fins as unmasked fins; and
    applying ion implantation to the unmasked fins to convert the unmasked fins into dielectric fins.

7. The method of claim 6, wherein masking the first subset of fins comprises depositing photoresist.

8. The method of claim 6, wherein masking the first subset of fins comprises depositing oxide.

* * * * *